United States Patent [19]
Eisele et al.
[11] 3,800,192
[45] Mar. 26, 1974

[54] SEMICONDUCTOR CIRCUIT ELEMENT WITH PRESSURE CONTACT MEANS

[76] Inventors: Dieter Eisele, E. Ludwigstrasse; Klaus Weimann, Buerstaederstr. 97, both of Lampertheim, Germany; Otto Schaerli, Muehlebergweg 2, Baden, Switzerland

[22] Filed: July 30, 1973

[21] Appl. No.: 383,895

Related U.S. Application Data

[63] Continuation-in-part of Ser. No. 170,027, Aug. 9, 1971, abandoned.

[52] U.S. Cl. .............. 317/234 R, 165/80, 174/52 S, 317/234 A, 317/234 E, 317/234 P
[51] Int. Cl. .............. H01l 3/00, H01l 5/00
[58] Field of Search ............ 317/234, 1, 3, 6, 4, 11; 165/80; 29/589; 174/52 S

[56] References Cited

UNITED STATES PATENTS

| | | | |
|---|---|---|---|
| 3,058,041 | 10/1962 | Happ | 317/235 |
| 3,261,396 | 7/1966 | Trunk | 165/80 |
| 3,313,987 | 4/1967 | Boyer | 317/234 |
| 3,395,321 | 7/1968 | Boyer | 317/234 |
| 3,396,316 | 8/1968 | Wislocky | 317/234 |
| 3,566,958 | 3/1971 | Zelina | 165/80 |
| 3,581,163 | 5/1971 | Eriksson | 317/234 |
| 3,597,524 | 8/1971 | Schreiner | 174/52 |
| 3,651,383 | 3/1972 | Livezey et al. | 317/234 |

*Primary Examiner*—Andrew J. James
*Attorney, Agent, or Firm*—W. G. Fasse; W. W. Roberts

[57] ABSTRACT

The present semiconductor circuit elements employ pressure contact means for establishing the necessary contact between the semiconductor body proper and ductile electrodes. These contact means comprise contact discs and the ductile electrodes have outwardly directed rims into which the discs fit to symmetrically locate these discs relative to the center axis of the device. Means are also provided for holding the ductile electrodes in place.

15 Claims, 3 Drawing Figures

SEMICONDUCTOR CIRCUIT ELEMENT WITH PRESSURE CONTACT MEANS

BACKGROUND OF THE INVENTION

This application is a continuation-in-part application of Ser. No. 170,027 filed Aug. 9, 1971, and now abandoned.

The invention relates to semiconductor circuit elements having a disc-shaped semiconductor body possessing at least one pn-junction in which body is clamped between two pressure contact elements, and wherein electrodes are interposed between the semiconductor body and the contact elements.

Normally to provide a large-area contact between active parts of semiconductor power devices, molybdenum or tungsten discs are used which serve simultaneously as current carrying contacts and as carrier plates for the highly brittle semiconductor body. Molybdenum or tungsten provide the best compromise between the thermal conductivity, the electrical conductivity and the coefficient of thermal expansion. The thermal expansion coefficient of these two metals corresponds more or less to that of the semiconductor material, otherwise it would be impossible to provide an intimate physical connection between the pressure contact elements or the carrier plates and the semiconductor body something which hitherto was considered unavoidable for achieving a good heat dissipation and good electrical conduction.

The use of carrier plates of molybdenum or tungsten which are alloyed to the semiconductor body presents drawbacks, however. There are difficulties in achieving an intimate or alloyed physical connection between discs of these materials and the semiconductor body. In this connection a series of possible techniques for overcoming the difficulties are known. It is known to coat both the semiconductor body and the carrier plates with one or more metal layers and then brazing or soft soldering the individual discs to each other. It is also known to deposit layers of tungsten or molybdenum on the semiconductor body by chemical means. Intermediate layers, for example, of aluminum have already been used which alloys both with the semiconductor material and with the material of the carrier plates. In each case, however, the intimate physical or alloyed connection between the semiconductor body and other materials requires a difficult operation which should be avoided if possible.

The carrier or contact plates are normally arranged on cooling devices which also conduct the current. These devices generally consist of copper or a copper alloy. Due to the different thermal expansion coefficients of the carrier plate material and of the cooling device material, a change to pressure contacting was made at a very early stage. Pressure contacting avoids an intimate physical or an alloyed connection between the carrier plate and the cooling body.

There has been no lack of attempts to overcome the need for an alloyed physical connection between the semiconductor body and the carrier plate. For example, U.S. Pat. No. 3,313,988 describes a pressure-contact semiconductor device in which a semiconductor body is clamped between pressure elements with ductile electrodes interposed between the pressure elements and the semiconductor body thus avoiding the use of alloyed-on or soldered-on carrier plates. The practical manufacture of elements of this kind, however, has posed a number of difficulties. For example, the way in which the semiconductor body is clamped is very critical. The structure of the pressure contact elements disclosed in said U.S. Pat. No. 3,313,987 could not achieve the desired success because the semiconductor body is unable in its inoperative condition and even more so in its operative condition when it is subjected to the full electrical and thermal load, to withstand the resultant non-uniform pressure distribution over its surface. The two end faces are subjected to different conditions and the resultant forces lead to the failure of the semiconductor body.

OBJECTS OF THE INVENTION

The invention aims to overcome the outlined drawbacks, more specifically to provide a method and semiconductor structure which overcomes the difficulties hitherto encountered due to the nature of contacting, especially pressure contacting.

SUMMARY OF THE INVENTION

According to the invention a semiconductor device is provided having a disc-shaped semiconductor body with at least one pn-junction. The semiconductor body is clamped between two pressure contact elements with ductile electrodes being interposed between the body and the contact elements. The ductile electrodes have a cup or disc form with up-turned edges facing the pressure contact elements. Further, the pressure contact elements are provided on the end faces facing toward the semiconductor body with pressure areas which are symmetrical relative to a center line of the device. The diameter of the inner bottoms of the ductile electrodes are approximately the same as the diameter of the contact areas of the pressure contact elements.

It is the above combination of features which results in a directly pressure-contacted semiconductor device capable of withstanding extremely high thermal and electrical loads. The clamping force which largely determines the thermal and electrical transition characteristics can now be selected freely without consideration of the mechanical properties of the semiconductor material. The present structure of the ductile electrode assures the desired pressure symmetry so to speak right from the start.

The cup shaped electrodes are attached to the semiconductor body by suitable means whereby the assembly of the device is substantially simplified. Surprisingly, this technique has an additional unexpected effect. If, for some reason or other, for example for making a manufacturing check, the pressure contact is released, the semiconductor body rotated relative to the electrodes and/or pressure contact elements, and then re-assembled, it has been noted that the device undergoes a change in its electrical and thermal properties, generally a change for the worse. The reason for this behavior is possibly as follows. When the clamping force is applied, the electrodes which are generally made of silver undergo a change because the electrodes fit snugly into contact with the mating surface as is, after all, their function whereby they are work-hardened and lose their ductility. Thus, after release and displacement in the manner described above, the work-hardened electrodes can no longer perform their function. This problem has surprisingly been solved by the invention by attaching the electrodes to the semiconductor body right from the start. This attachment does not prevent any relative movements between the semiconductor body and the electrodes, which movements might be caused by the different coefficient of thermal expansion of the semiconductor material and of the electrodes. Nevertheless, it seems to control or reduce the work-hardening.

The holding means for attaching the cup shaped electrodes to the semiconductor body may be comprised of an elastic synthetic material having good adhesive property, and applied between the edges of the cup shaped electrodes and the adjacent surfaces of the semiconductor disc. The elastic firmly adhering synthetic material may be applied, for example, to the cup shaped electrodes at a plurality of locations around the periphery thereof.

BRIEF FIGURE DESCRIPTION

In order that the invention may be clearly understood, it will now be described, by way of example, with reference to the accompanying drawings, wherein.

DETAILED DESCRIPTION OF EXAMPLE EMBODIMENTS

The illustration is not to scale and as usual the electrodes and the semiconductor body have been shown exaggeratedly thick.

Figure 1:
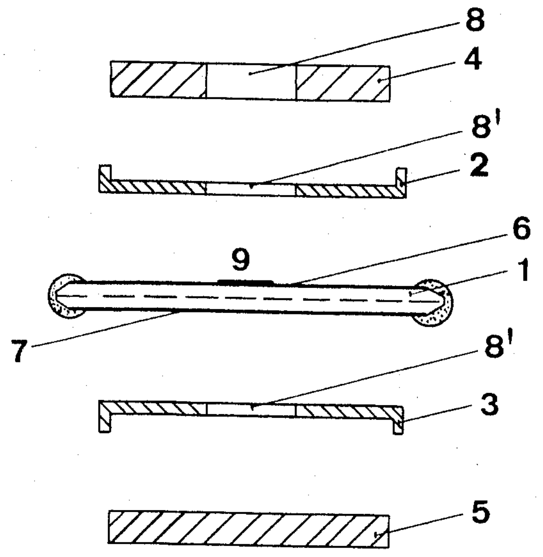
FIG. 1 illustrates in a sectional, exploded view one embodiment of a semiconductor device with contact means according to the invention.

Referring to FIG. 1, the semiconductor body 1 having opposed parallel faces or surfaces may be made, for example, of silicon or germanium. It has one or more pn-junctions and can, for example, be the active part of a thyristor. The edge of the semiconductor body 1 is double chambered in the conventional way, in order to increase the breakdown resistance. The pn-junctions appearing at the edge surfaces of the semi-conductor body are protected by a synthetic material 11, for example an epoxy resin, enveloping the edge zone.

The cup shaped or disc shaped ductile electrodes 2 and 3 each having a turned-up edge or rim disposed to face away from the respective facing surface of the semiconductor body 1 are made of sheet silver having a thickness of at least 0.05mm. Some other ductile material having the requisite electrical and thermal conductivity may alternatively be employed. Adjoining the electrodes 2 and 3 are metal discs 4 and 5 acting as pressure contact elements which must have the requisite hardness to be able to operate as pressure abutments for the electrodes and the semiconductor body. However, the thermal expansion coefficients of these pressure contact elements need not match that of the semiconductor material nor that of the cup shaped electrodes because in accordance with the invention there is no alloyed connection. It is merely necessary that these metal discs 4 and 5 be able to slide relative to the material of the electrodes 2 and 3 when they expand radially. In order to improve the sliding properties of the members forming a pressure contact pair, especially under high clamping pressure, the metal discs 4, 5 may be hard chrome plated or nickel plated, or even polished, if necessary.

The metal discs 4 and 5 may be made, but not necessarily, of molybdenum, tungsten or tantalum. It is advantageous to use for this purpose metals or metal alloys of good thermal and electrical conductivity. Thus, for example, copper or copper alloys may also be used.

The pressure contact elements formed, for example as metal discs 4 and 5 have identical shapes, e.g. identical diameters at their surfaces facing toward the semiconductor body 1. In this manner the semiconductor body 1 is symmetrically located, provided that the two pressure contact elements 4 and 5 are effective symmetrically relative to the center line of the semiconductor body 1. As a general rule, whatever the shape of the pressure contact elements, their end surfaces facing toward the semiconductor body 1, should have pressure surfaces which are disposed symmetrically relative to a center line of the semiconductor body.

Where an opening 8 is provided in one pressure contact element 4 as well as in the associated ductile electrode 2, in order to contact a control electrode 9 on the semiconductor body at least the other ductile electrode 3 at the opposite side of the semiconductor body 1 should also be provided with a like opening 8' so that pressure is applied to the semiconductor body in equal aligned areas on both sides of the body. The other pressure contact element 5 may also be provided with a respective opening (not shown).

Figure 2:
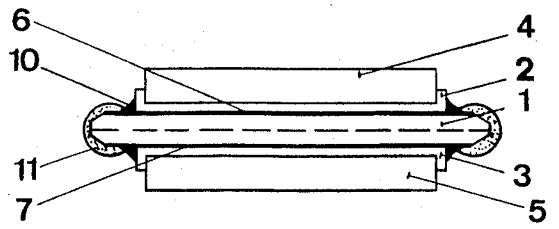
FIG. 2 is a cross sectional view of the circuit element of FIG. 1 in assembled form with the center openings omitted.

FIG. 2 illustrates a semiconductor device in the assembled condition in which it may be installed in a conventional pressure contact casing (not shown). The present circuit element may form the active member of a so called disc cell. Further, several semiconductor devices contacted in this way may be assembled to form a cascade device.

Figure 3:
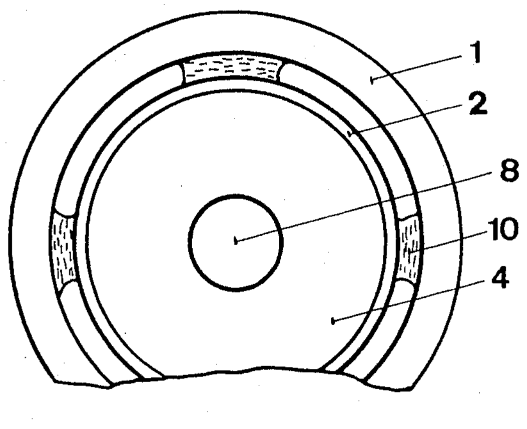
FIG. 3 is a plan view of the device of FIG. 1.

As shown in FIGS. 2 and 3, the electrodes 2 and 3 are secured to the semiconductor body or disc 1 by means of a resilient elastic, adhesive material such as a silicon rubber 10 or caoutchouc rubber. If an adhesive material such as caoutchouc rubber is employed, it may be applied in the form of liquid drops. The elastic adhesive material extends between the edges of the cup shaped electrodes 2 and 3 and the adjacent surfaces of the semiconductor body 1 outwardly of the cup shaped electrodes, whereby the cup shaped electrodes are held so that they can electrically contact the semiconductor body. As shown in FIG. 3, the adhesive material 10 may, if desired, be employed at only a few spaced locations around the periphery of the electrodes 2,3. The metal discs 4 and 5 are placed loosely into the electrodes 2, 3 whereby their radial position or rather their symmetrical position relative to the center line of the device is positively determined by the up-turned edges of these electrodes. For this purpose, in attaching the electrodes 2,3 to the semiconductor body 1, it must be assured that they are fitted symmetrically relative to the axis of the body 1, this can be achieved quite simply, however, for example in an appropriate die.

In order to improve the thermal and electrical transition or conduction between the semiconductor body 1 and the electrodes 2, 3, the contact areas of these members may be metallized. In FIGS. 1 and 2, these additional metal layers 6 and 7 are shown exaggeratedly thick and may comprise thin, gold plated nickel coatings.

The necessary contacts to the semiconductor body 1 are thus made according to the invention in such a way that alloyed connections between the semiconductor body 1 and any connecting electrodes are avoided except for the metallized surfaces 6 and 7 whereby the above advantages are achieved; namely, that it is no longer necessary to consider the different coefficients of thermal expansion of the surfaces which are in pressure contact with one another. The individual elements of the present device may slide relative to each other when they expand in response to temperature rises as in conventional pressure contacts. Another advantage is seen in that the pressure contact elements need not necessarily be made any more of tungsten, molybdenum, tantalum and carrier plate materials, rather the pressure contact elements may now be manufactured of materials having good thermal and electrical conductivities, whereby a more economic manufacture as well as a higher loading capacity are achieved.

Another advantage is seen in that it is no longer necessary to heat-treat the completely assembled product for providing proper contacts. Such heat-treatment is always necessary in connection with soldering or alloying operations in order to avoid the development of stresses in the system.

Last but not least, a special advantage of the contacting system in accordance with the invention should be mentioned. By obviating alloyed-in layers, so called fully diffused systems comprising sintered contact layers may be provided with contact means as taught by the invention. In this way, quite frequently considerable improvement in the operational characteristics of semiconductor circuit elements have been achieved.

Although the invention has been described with reference to specific example embodiments, it is to be understood that it is intended to cover all modifications and equivalents within the scope of the appended claims.

What is claimed is:

1. A semiconductor circuit element with pressure contact means, comprising a wafer semiconductor body having at least one pn-junction and two outwardly facing surfaces, said pressure contact means comprising two pressure contact elements for clamping said semiconductor body therebetween, said contact elements being arranged symmetrically on opposite facing surfaces of said body, and a single separate ductile electrode interposed between each outwardly facing surface of the semiconductor body and the respective pressure contact element, said pressure contact elements having identical inwardly facing surfaces facing the respective outwardly facing surface of the semiconductor body and disposed symmetrically toward the respective semiconductor body surface, said identical inwardly facing surfaces providing pressure areas arranged symmetrically relative to a center line of the circuit element, said ductile electrodes having a dished shape with an up-turned rim surrounding an inner, outwardly facing bottom, each bottom having a diameter corresponding to that of the respective one of said pressure contact elements so that the radial position of the respective pressure contact element inside said rim is automatically fixed and centered relative to the corresponding ductile electrode, and resilient adhesive holding means between the edges of said ductile electrodes and the edges of said body for symmetrically holding said ductile electrodes on said outwardly facing surfaces of said semiconductor body, whereby the position of the respective contact elements is automatically centered.

2. The semiconductor circuit element of claim 1, wherein said resilient means comprises an adhesive elastic between the edges of said ductile electrodes, and the edges of the surfaces of said body.

3. The semiconductor circuit element of claim 1, wherein the diameters of the inwardly facing surfaces of said pressure contact elements in contact with the respective ductile element are smaller than the diameter of the semiconductor body.

4. The semiconductor circuit element as claimed in claim 1, wherein the pressure contact elements are discs having the same diameter.

5. The semiconductor circuit element as claimed in claim 1, wherein the pressure contact elements are manufactured from hard copper having contact areas for contacting said outwardly facing surfaces of said semiconductor body.

6. The semiconductor circuit element as claimed in claim 1, wherein the pressure contact elements are manufactured from a copper alloy having contact areas for contacting said outwardly facing surfaces of said semiconductor body.

7. The semiconductor circuit element as claimed in claim 1, wherein said contact areas of the pressure contact elements are hard copper plated.

8. The semiconductor circuit element as claimed in claim 1, wherein said contact areas of the pressure contact elements are nickel plated.

9. The semiconductor circuit element as claimed in claim 1, wherein said outwardly facing surfaces of the semiconductor body are provided with a thin metal layer.

10. The semiconductor circuit element as claimed in claim 9, wherein said thin metal layer of the semiconductor body comprises nickel plating.

11. The semiconductor circuit element as claimed in claim 9, wherein said thin metal layer of the semiconductor body comprises gold plating.

12. The semiconductor circuit element as claimed in claim 1, wherein said ductile electrodes are made of silver which has a thickness of at least 0.05 mm.

13. The semiconductor circuit element as claimed in claim 1, wherein said pressure contact elements are laid loosely inside the rim of the ductile electrodes on both sides of the semiconductor body.

14. The semiconductor circuit element as claimed in claim 1, wherein said ductile electrodes have an end face opposite said bottom, said end face providing solderless pressure contact means in contact with the respective outwardly facing surface of the semiconductor body, and said bottom providing solderless pressure contact means in contact with the respective pressure contact element.

15. The semiconductor circuit element as claimed in claim 1, comprising an opening in one pressure contact element and in the respective ductile electrode, a control electrode in electrical contact with the semiconductor body in said opening and a further corresponding opening in the opposite ductile electrode on the other surface of the semiconductor body.

* * * * *

UNITED STATES PATENT OFFICE
CERTIFICATE OF CORRECTION

Patent No. 3,800,192 Dated March 26, 1974

Inventor(s) Dieter Eisele et al

It is certified that error appears in the above-identified patent and that said Letters Patent are hereby corrected as shown below:

[30] Foreign Application Priority Data

August 11, 1970 Germany P 20 39 806.5

Signed and sealed this 3rd day of December 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
★ U.S. GOVERNMENT PRINTING OFFICE : 1969 O—366-334.